United States Patent
Lee et al.

(10) Patent No.: US 7,271,436 B2
(45) Date of Patent: Sep. 18, 2007

(54) FLASH MEMORY DEVICES INCLUDING A PASS TRANSISTOR

(75) Inventors: Chang-Hyun Lee, Gyeonggi-do (KR); Sang-Pil Sim, Gyeonggi-do (KR); Seung-Keun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 48 days.

(21) Appl. No.: 11/021,232

(22) Filed: Dec. 23, 2004

(65) Prior Publication Data

US 2006/0030102 A1 Feb. 9, 2006

(30) Foreign Application Priority Data

Aug. 3, 2004 (KR) ............. 10-2004-0061231

(51) Int. Cl.
*H01L 29/76* (2006.01)
*H01L 29/788* (2006.01)
*H01L 29/94* (2006.01)
*H01L 31/00* (2006.01)

(52) U.S. Cl. .............. 257/314; 257/313; 257/312; 257/315; 257/E21.129; 257/401; 257/369; 257/371; 257/393

(58) Field of Classification Search ............ 257/314, 257/313, 312, 316, 315, 318, E29.129, 401, 257/327, 369, 371, 393; 438/258
See application file for complete search history.

(56) References Cited

U.S. PATENT DOCUMENTS 4,908,327 A * 3/1990 Chapman ............... 438/231
5,394,358 A * 2/1995 Huang .................... 365/182
5,638,327 A 6/1997 Dallabora et al. ..... 365/185.33
6,020,227 A * 2/2000 Bulucea .................. 438/194
6,157,064 A * 12/2000 Huang .................... 257/344
6,608,345 B2 * 8/2003 Kunikiyo et al. ......... 257/314
6,949,788 B2 * 9/2005 Fujiwara et al. ......... 257/314
7,005,699 B2 * 2/2006 Chen et al. .............. 257/315
7,006,378 B1 * 2/2006 Saito et al. ............ 365/185.05
2001/0031532 A1 * 10/2001 Tsugane et al. ........ 438/258
2004/0262665 A1 * 12/2004 Iwata et al. ............. 257/314
2004/0262666 A1 * 12/2004 Matsuoka et al. ........ 257/314
2005/0194633 A1 * 9/2005 Mori ..................... 257/324
2005/0230736 A1 * 10/2005 Ishimaru et al. .......... 257/314
2005/0258468 A1 * 11/2005 Colombo et al. ......... 257/314

FOREIGN PATENT DOCUMENTS

KR 000002905 1/2000
KR 1020040008534 1/2004

* cited by examiner

Primary Examiner—Walter L Lindsay, Jr.
(74) Attorney, Agent, or Firm—Myers Bigel Sibley & Sajovec

(57) ABSTRACT

Flash memory integrated circuit devices include an integrated circuit substrate. A cell array on the integrated circuit substrate includes a plurality of cell transistors. A bit line is coupled to ones of the plurality of cell transistors and a first pass transistor is coupled to the bit line. The first pass transistor has a first diffusion structure configured to provide a breakdown voltage higher than that of a second diffusion structure. One or more second pass transistor(s) are coupled to the first pass transistor. The second pass transistor(s) have the second diffusion structure. The second diffusion structure may have a resistance smaller than a resistance of the first diffusion structure.

20 Claims, 10 Drawing Sheets

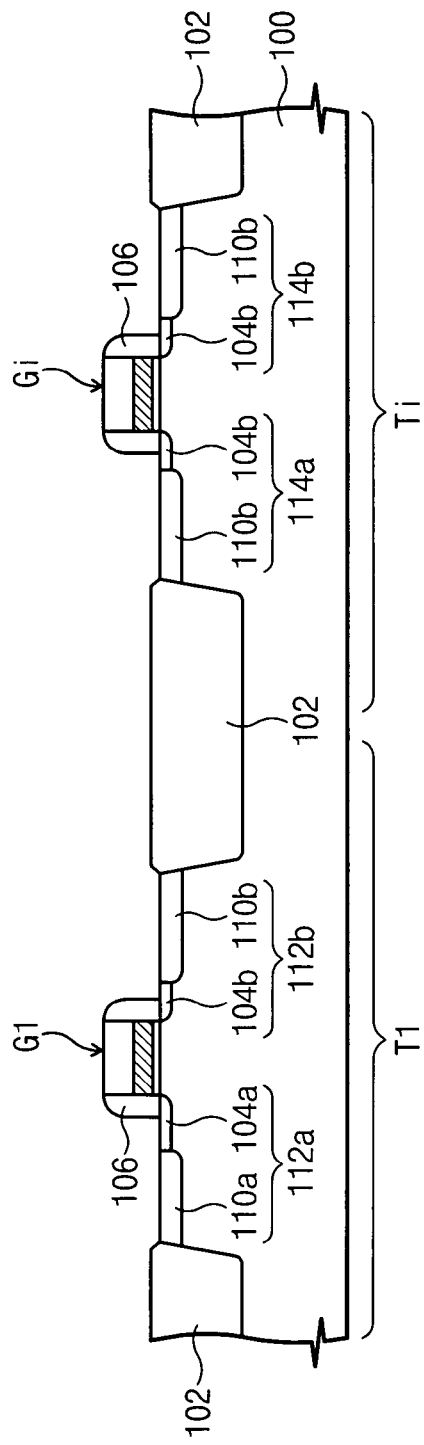
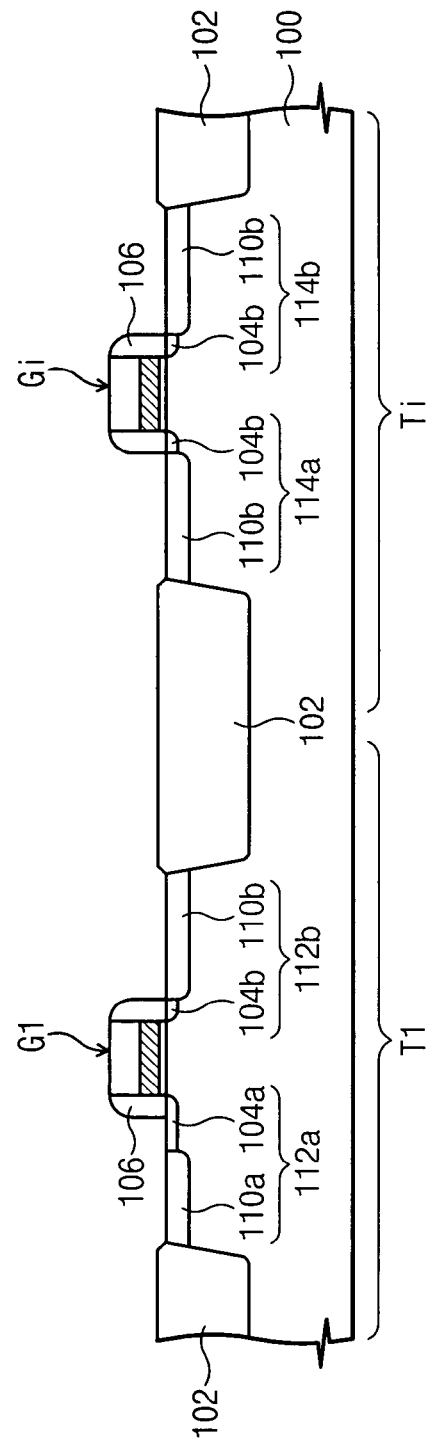

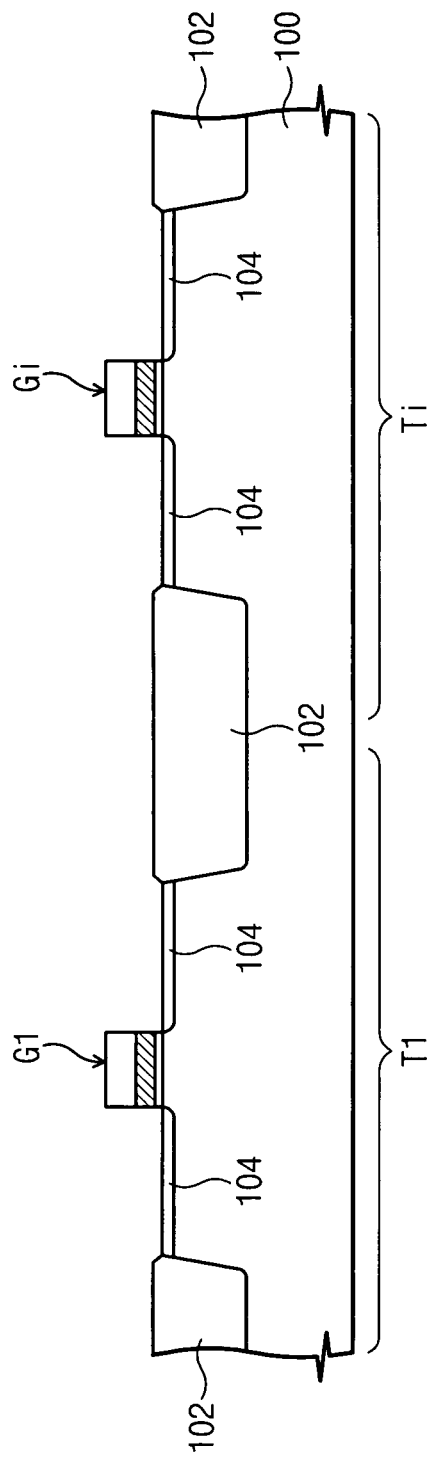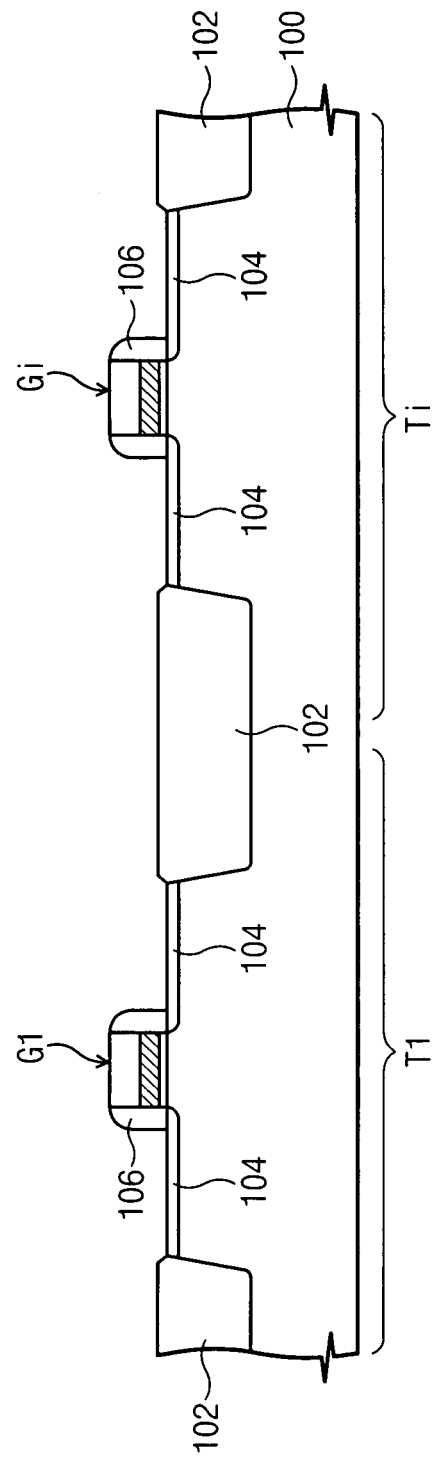

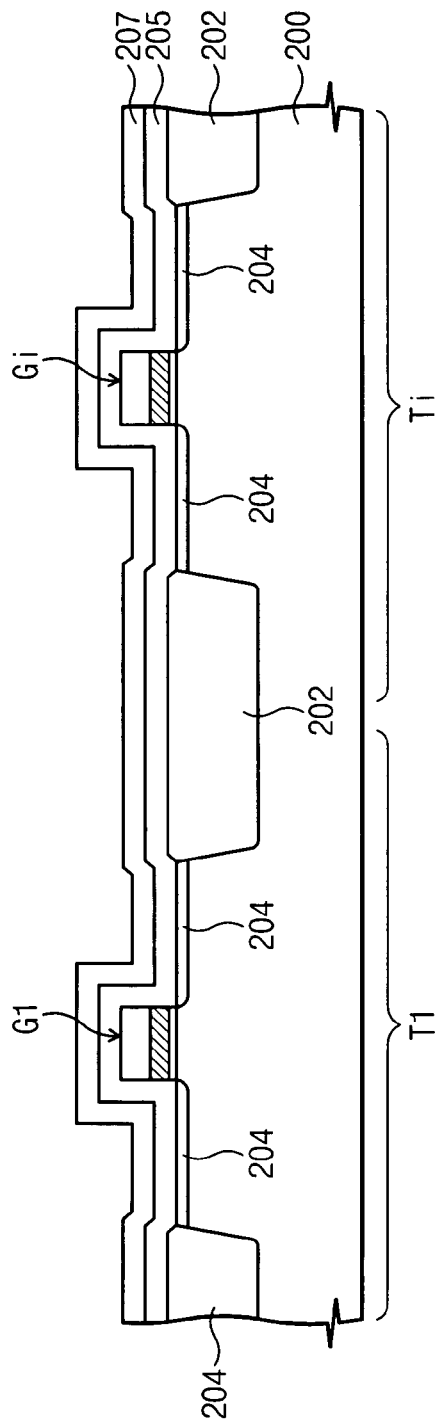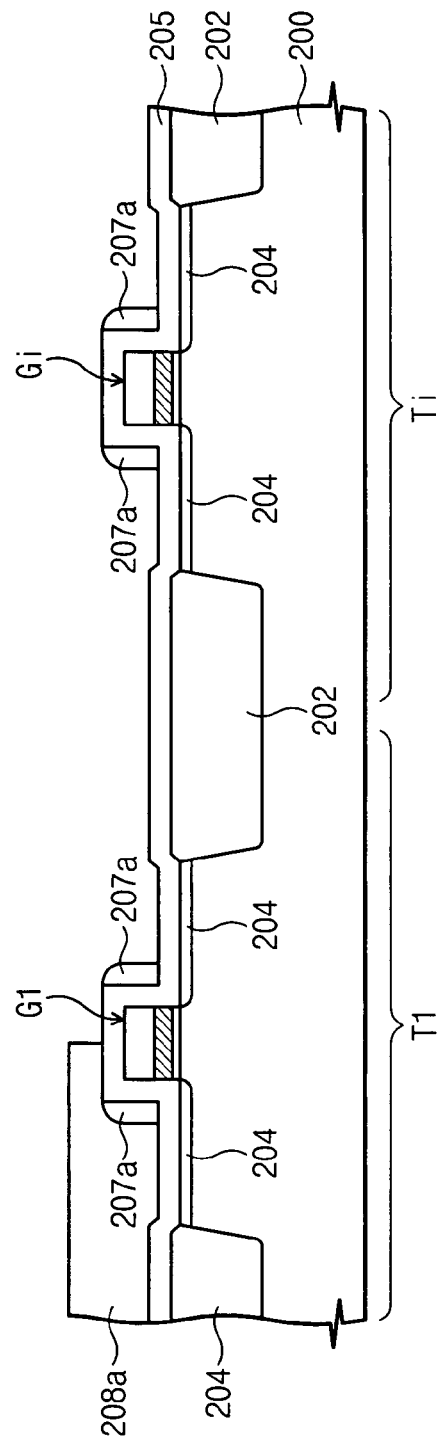

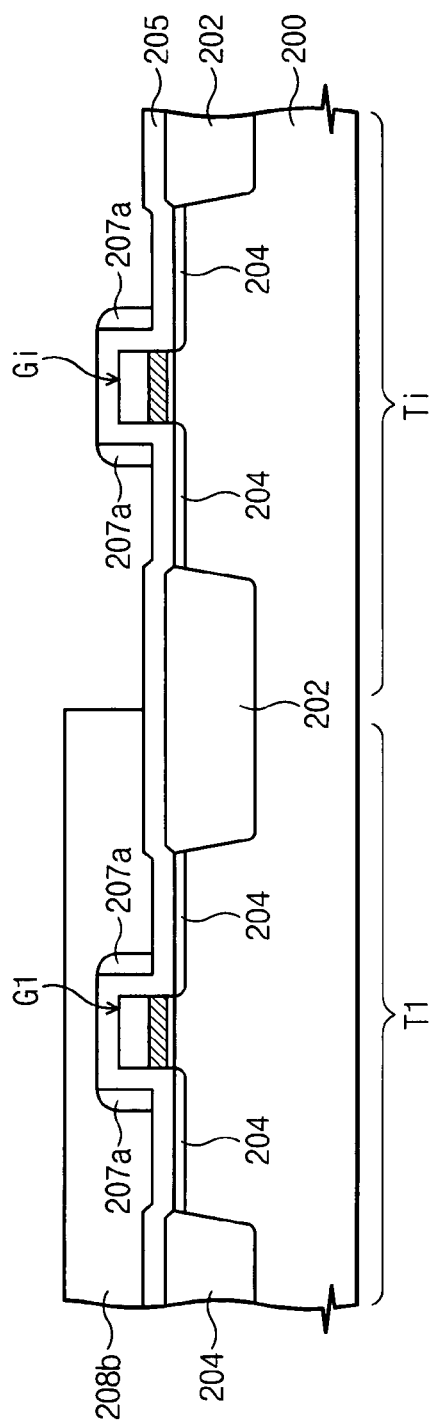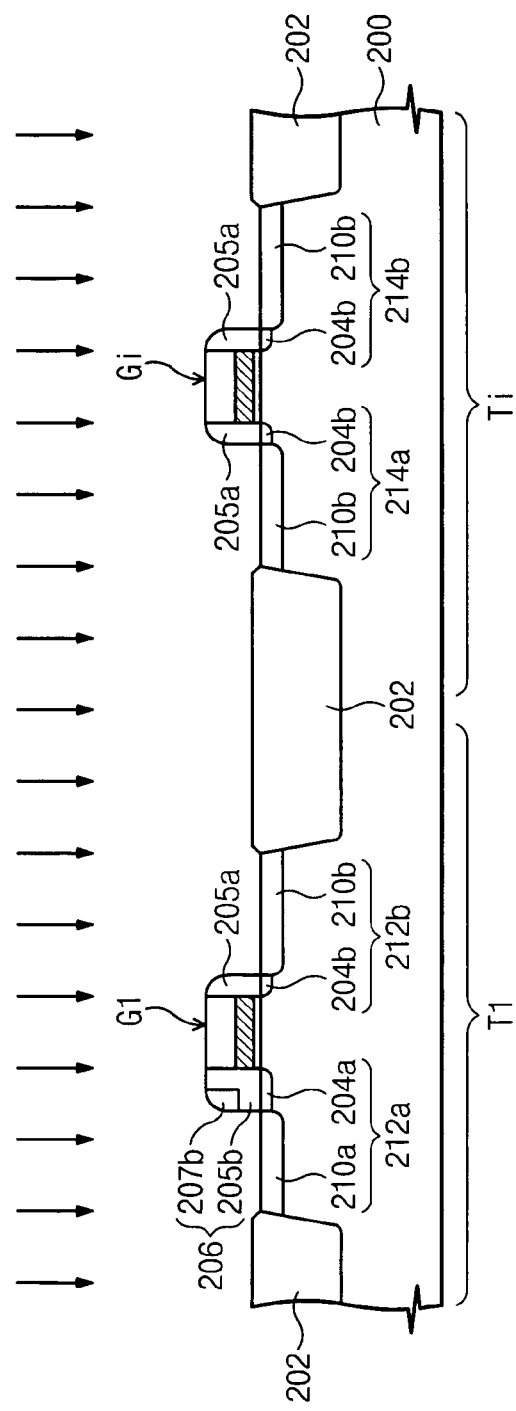

FLASH MEMORY DEVICES INCLUDING A PASS TRANSISTOR

CROSS-REFERENCE TO RELATED APPLICATION

This application is related to and claims priority from Korean Patent Application No. 2004-61231, filed on Aug. 3, 2004, the disclosure of which is hereby incorporated herein by reference in its entirety.

BACKGROUND OF THE INVENTION

The present invention relates to integrated circuit devices and, more particularly, to flash type memory integrated circuit devices and methods of forming the same.

A NOR type flash memory device typically including a cell array having a plurality of cell transistors disposed along rows and columns, word lines, and bit lines. A word line generally connects to gate electrodes of the cell transistors in a row direction (or a column direction) connected in parallel and a bit line generally connects to a drain region of the cell transistors in a column direction (or a row direction) connected in parallel. Such a NOR type flash memory device typically selects a cell transistor by a word line and a bit line. A decoder may be placed around the cell array that includes a plurality of transistors used to select the word line and the bit line.

FIG. 1 is an equivalent circuit diagram illustrating a cell array and a decoder in a conventional NOR type flash memory. As shown in FIG. 1, the NOR type flash memory device includes a cell array 10, a decoder 20 for selecting a word line and a decoder 30 for selecting a bit line. The cell array 10 includes a plurality of cell transistors Tc. A plurality of selection transistors $Y_1 \sim Y_i$ arranged in a pyramid structure or a tree structure so as to facilitate selection of a bit line. With respect to each bit line (vertically extending in FIG. 1), groups of the plurality of cell transistors Tc are connected in series and electrically connected to a corresponding one of the bit lines.

The illustrated flash memory device typically includes high voltage transistors because high voltage operation is generally required. For example, as a source of a transistor connected to a bit line is typically boosted with a well bias in an erasing operation, a high junction breakdown voltage is generally desired. The high voltage transistors may be formed to have a low doped drain (LDD) structure or a double diffused drain (DDD) junction structure including a heavily doped diffusion layer and a lightly doped diffusion layer and the heavily doped diffusion layer may be formed separated from the gate electrode in order to provide a high breakdown voltage.

If the heavily doped diffusion layer is separated from the gate electrode, the breakdown voltage may be increased and a punch through may be suppressed. However, as an area ratio of the heavily doped diffusion layer may be reduced, an amount of saturation current may be decreased. A decrease of the saturation current of the high voltage selection transistors $Y_1 \sim Y_i$ connected between the bit lines and the sense amplifier 40 may reduce a margin for reading a logic value of a cell transistor Tc. A saturation current of the high voltage transistors $Y_1 \sim Y_i$ connected between the bit line and the sense amplifier 40 may increase in proportion to a channel width of the transistor and/or an area of a source/drain thereof, but an area for the transistor connected between the bit line and the sense amplifier generally can only be increased to a limited amount. In particular, only a single selection transistor is directly connected to each bit line as shown in FIG. 1, so the ability to increase the area is generally restricted.

SUMMARY OF THE INVENTION

Embodiments of the present invention provide flash memory integrated circuit devices including an integrated circuit substrate, such as NOR-type flash memory devices. A cell array on the integrated circuit substrate includes a plurality of cell transistors. A bit line is coupled to ones of the plurality of cell transistors and a first pass transistor is coupled to the bit line. The first pass transistor has a first diffusion structure configured to provide a breakdown voltage higher than that of a second diffusion structure. One or more second pass transistor(s) are coupled to the first pass transistor. The second pass transistor(s) have the second diffusion structure. The second diffusion structure may have a resistance smaller than a resistance of the first diffusion structure.

In other embodiments of the present invention, the first diffusion structure includes a first lightly doped diffusion layer adjacent a gate of the first pass transistor and a first heavily doped diffusion layer separated from the gate by the first lightly doped diffusion layer. The first diffusion structure defines a source or drain region of the first pass transistor that is coupled to the bit line. The second diffusion structure may include a second lightly doped diffusion layer adjacent a gate of the at least one second pass transistor and a second heavily doped diffusion layer separated from the gate of the at least one second pass transistor by the second lightly doped diffusion layer. The first lightly doped diffusion layer may have a width from the gate of the first pass transistor to the first heavily doped diffusion layer greater than a width of the second lightly doped diffusion layer from the gate of the at least one second pass transistor to the second heavily doped diffusion layer. The first diffusion structure may be a source of the first pass transistor and a drain of the first pass transistor may have the second diffusion structure or may have the first diffusion structure.

In further embodiments of the present invention, sidewall spacers are formed on the gate of the first pass transistor and on the gate of the second pass transistor and a boundary between the second lightly doped diffusion layer and the second highly doped diffusion layer is aligned to one of the sidewall spacers. A width of one of the sidewall spacers associated with the first diffusion structure may be wider than a width of the one of the sidewall spacers aligned with the boundary between the second lightly doped diffusion layer and the second highly doped diffusion layer. The first pass transistor and the second pass transistor(s) may be high voltage transistors.

In yet other embodiments of the present invention, flash memory devices have a cell array including a plurality of cell transistors. A bit line is coupled in parallel to drains of specific ones of the cell transistors. A first high voltage transistor includes a source region having a first diffusion structure that is connected to the bit line, a drain region and a gate between the source region and the drain region. A plurality of second high voltage transistors are connected in series to the drain of the first high voltage transistor. The second high voltage transistors each include a source region and a drain region having a second diffusion structure and a gate between the source region and the drain region thereof. The first diffusion structure includes a first lightly doped diffusion layer neighboring the gate of the first high voltage transistor and a first heavily doped diffusion layer separated from the gate of the first high voltage transistor by the first lightly doped diffusion layer. The second diffusion structure includes a second lightly doped diffusion layer neighboring the gate of one of the second high voltage transistors, having a width smaller than a width of the first lightly doped diffusion layer, and a second heavily doped diffusion layer separated apart from the gate of the one of the second high voltage transistors, the second highly doped diffusion layer being nearer its associated gate than the first heavily doped diffusion layer is to the gate of the first high voltage transistor.

In further embodiments of the present invention, a sidewall spacer is formed on each gate sidewall of the first and second high voltage transistors and the first lightly doped diffusion layer and the second lightly doped diffusion layer extend beyond the sidewall spacers. In some embodiments, the first lightly doped diffusion layer extends out beyond the sidewall spacer and a boundary between the second lightly doped diffusion layer and the second heavily doped diffusion layer overlaps associated ones of the sidewall spacers. A width of a sidewall spacer on the first diffusion structure may be wider than a width of a sidewall spacer on the second diffusion structure.

In yet other embodiments of the present invention, flash memory devices include a cell array having a plurality of cell transistors. A bit line is coupled in parallel to drains of ones of the cell transistors. A first high voltage transistor has a source region of a first diffusion structure connected in series to the bit line and a drain region having a second diffusion structure and a gate between the source and the drain. A plurality of second high voltage transistors are connected in series to the drain of the first high voltage transistor, ones of the second high voltage transistors including a source region and a drain region having the second diffusion structure and a gate therebetween. Sidewall spacers are formed on sidewalls of the gates of the first and second high voltage transistors. The first diffusion structure includes a first lightly doped diffusion layer adjacent the gate of the first high voltage transistor and a first heavily doped diffusion layer separated apart from the gate of the first high voltage transistor by the first lightly doped diffusion layer. The second diffusion structure includes a second lightly doped diffusion layer formed under a sidewall spacer of an associated gate, adjacent the associated gate, and a second heavily doped diffusion layer separated from the associated gate by the second lightly doped diffusion layer. A boundary of the second heavily doped diffusion layer is aligned to the sidewall spacer of the associated gate.

In further embodiments of the present invention, the first lightly doped diffusion layer extends beyond the sidewall spacer. A first sidewall spacer may be formed on the first diffusion structure and a second sidewall spacer, having a width narrower than a width of the first sidewall spacer, may be formed on the second diffusion structure. A boundary of the first heavily doped diffusion layer may be aligned to the first sidewall spacer. The first sidewall spacer may include a L-shaped lower spacer formed on the sidewall of the first high voltage transistor and an upper spacer formed on the L-shaped lower spacer.

In yet other embodiments of the present invention, flash memory devices include a cell array having a plurality of cell transistors. A bit line is coupled in parallel to specific ones of the cell transistors. A first high voltage transistor includes a source region and a drain region having a first diffusion structure, the source region being connected in series to the bit line. A plurality of second high voltage transistors are connected to the drain of the first high voltage transistor in series. The second high voltage transistors include a source region and a drain region having a second diffusion structure. A sidewall spacer is formed on sidewalls of gates of the first and second high voltage transistors. The first diffusion structure includes a first lightly doped diffusion layer neighboring the gate of the first high voltage transistor and a first heavily doped diffusion layer separated apart from the gate of the first high voltage transistor by the first lightly doped diffusion layer. The second diffusion structure includes a second lightly doped diffusion layer formed under the sidewall spacer of an associated gate and located adjacent the associated gate and a second heavily doped diffusion layer separated from the associated gate by the second lightly doped diffusion layer. A boundary of the second heavily doped diffusion layer is aligned to the sidewall spacer of the associated gate.

In other embodiments of the present invention, methods of forming a flash memory integrated circuit device include forming a cell array including a plurality of cell transistors on an integrated circuit substrate. A bit line is formed coupled to ones of the plurality of cell transistors. A first pass transistor is formed coupled between the bit line and the ones of the plurality of transistors. The first pass transistor has a first diffusion structure configured to provide a breakdown voltage higher than that of a second diffusion structure. At least one second pass transistor is formed coupled between the pass transistor and the ones of the plurality of cell transistors. The at least one second pass transistor has the second diffusion structure.

In further embodiments of the present invention, forming a first pass transistor includes forming a gate of the first pass transistor, forming a first lightly doped diffusion layer adjacent a gate of the first pass transistor, and forming a first heavily doped diffusion layer separated from the gate by the first lightly doped diffusion layer to define the first diffusion structure. The first diffusion structure includes a source or drain region of the first pass transistor that is coupled to the bit line. Forming at least one second pass transistor may include forming a gate of the at least one second pass transistor, forming a second lightly doped diffusion layer adjacent the gate of the at least one second pass transistor, and forming a second heavily doped diffusion layer separated from the gate of the at least one second pass transistor by the second lightly doped diffusion layer. The first lightly doped diffusion layer may have a width from the gate of the first pass transistor to the first heavily doped diffusion layer greater than a width of the second lightly doped diffusion layer from the gate of the second pass transistor to the second heavily doped diffusion layer.

In other embodiments of the present invention, methods are provided for forming a flash memory device including a first high voltage transistor having a source region connected in series to a bit line, the bit line coupled to drains of ones of cell transistors of a cell array, and a plurality of second high voltage transistors connected in series to a drain region of the first high voltage transistor. Gates of the first and second high voltage transistors are formed on an integrated circuit substrate. Low-concentration impurities are implanted in the substrate at both sides of the gates and sidewall spacers are formed on sidewalls of the gates. High-concentration impurities are implanted in the substrate in a region separated from the gates at both sides of the gates. A distance from the gate of the second high voltage transistor to a source region or a drain region of the second high voltage transistor is shorter than a distance from the gate of the first high voltage transistor to the source region of the first high voltage transistor.

In further embodiments of the present invention, implanting high-concentration impurities includes forming a photoresist pattern extending from an upper portion of the gate of the first high voltage transistor to cover a predetermined region of the source region of the first high voltage transistor with the implanted low-concentration impurities and implanting high-concentration impurities in the substrate using the photoresist pattern and the sidewall spacers as an ion-implantation mask. Forming sidewall spacers may include stacking a lower spacer insulating layer and an upper spacer insulating layer conformally on a surface of the substrate including the gates, anisotropic etching the upper spacer insulating layer and partial isotropic etching the upper spacer insulating layer to form an upper sidewall spacer on the source region of the first high voltage transistor, and anistropic etching the lower spacer insulating layer to form an L-shaped lower sidewall spacer intervening between a sidewall of the gate of the first high voltage transistor facing the source region of the first high voltage transistor and the upper sidewall spacer and to concurrently form a single layer sidewall spacer on a sidewall of the gate of the second high voltage transistors. Implanting high-concentration impurities may include implanting the high-concentration impurities using the upper and lower sidewall spacers and the single layer sidewall spacer as an ion implantation mask. The upper sidewall spacer and the lower sidewall spacer may be formed on the drain region of the first high voltage transistor.

BRIEF DESCRIPTION OF THE DRAWINGS

The present invention will now be described with reference exemplary embodiments illustrated in the attached drawings in which:

FIGS. 3A and 3B are cross-sectional views illustrating pass gates of a NOR type flash memory device according to some embodiments of the present invention.

FIGS. 4, 5, 6A and 6B are a cross-sectional views illustrating operations for forming a NOR type flash memory integrated circuit device according to some embodiments of the present invention.

FIGS. 8, 9A and 10A are cross-sectional views illustrating operations for forming a NOR type flash memory integrated circuit device according to yet further embodiments of the present invention.

FIGS. 9B and 10B are cross-sectional views illustrating operations for forming a NOR type flash memory integrated circuit device according to other embodiments of the present invention.

DETAILED DESCRIPTION OF THE INVENTION

Figure 1:
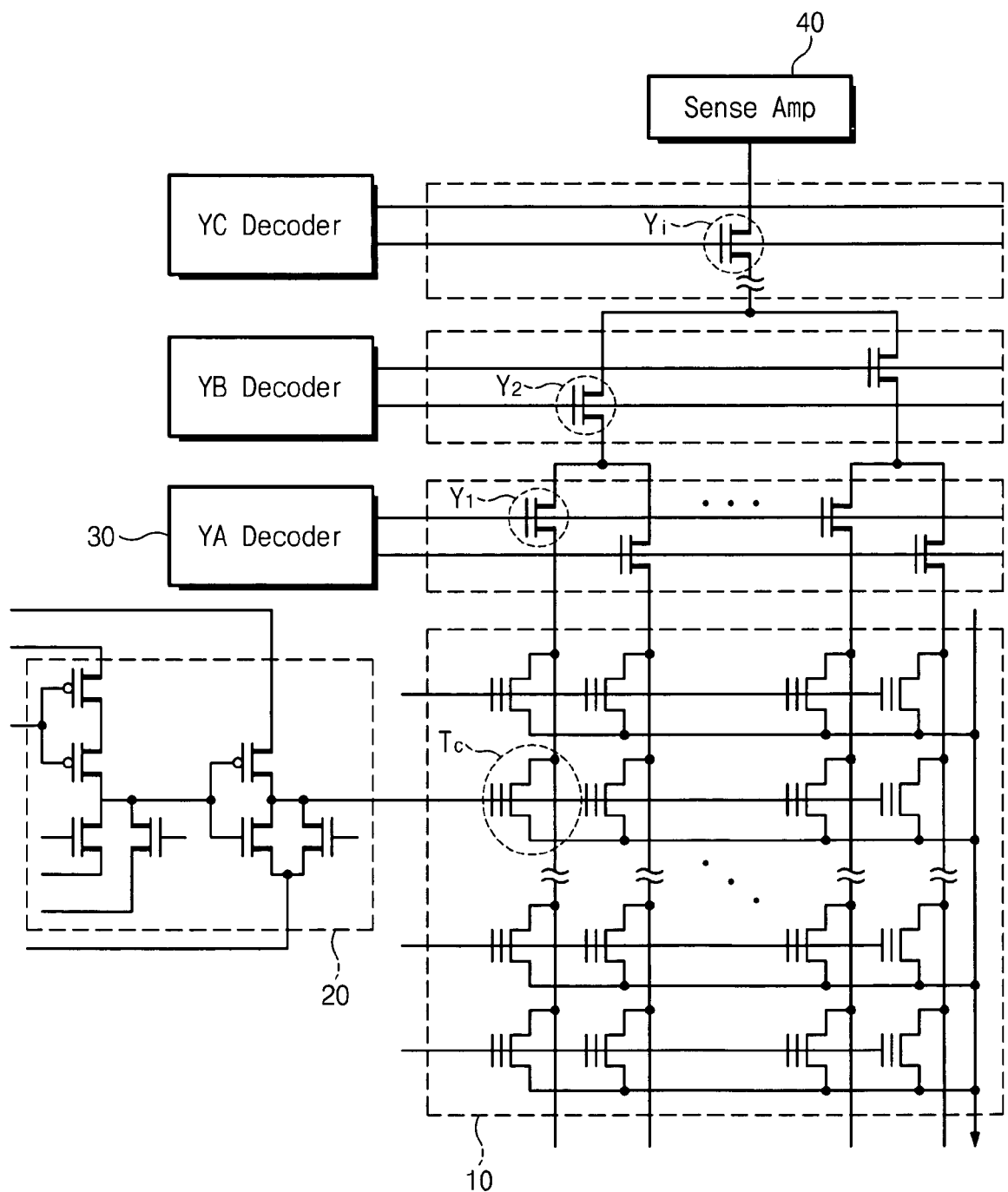
FIG. 1 is an equivalent circuit diagram illustrating a core of a NOR type flash memory device according to the prior art.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Figure 2:
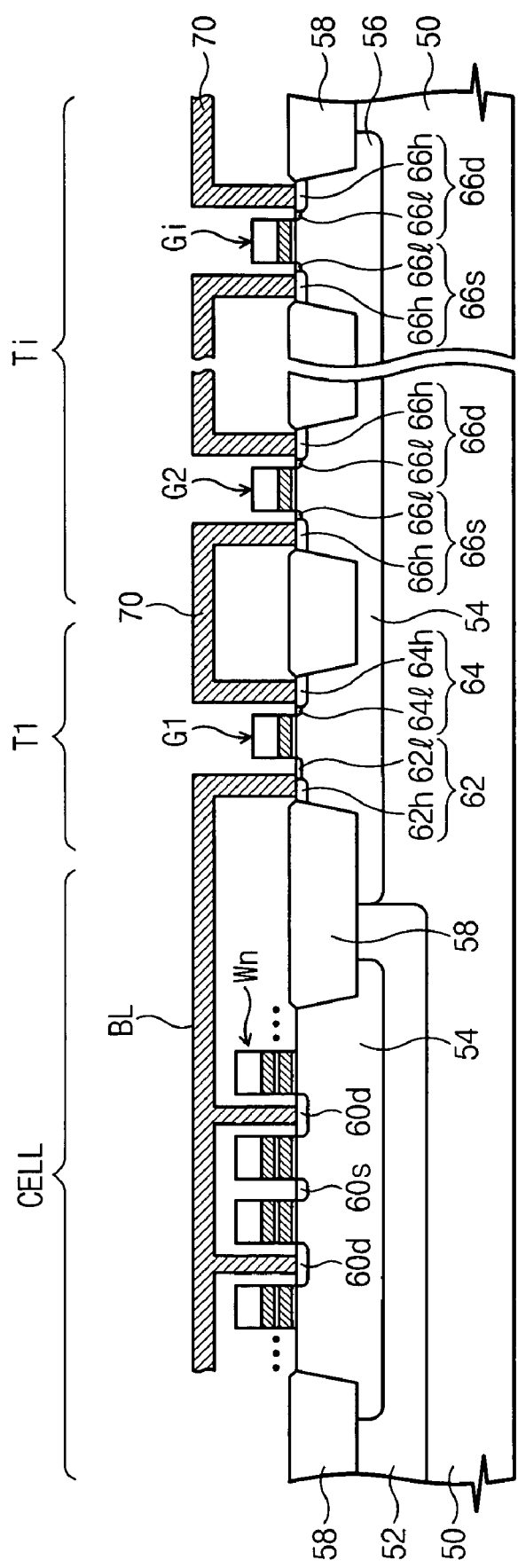
FIG. 2 is a cross-sectional view illustrating a NOR type flash memory integrated circuit device in according to some embodiments of the present invention.

Various embodiments of the present invention will now be described with reference to the cross-sectional view of FIG. 2. FIG. 2 is a cross-sectional view of a NOR type flash memory integrated circuit device in accordance with some embodiments of the present invention. It will be understood that other types of flash memory devices may also be provided by some embodiments of the present invention. As shown in the embodiments of FIG. 2, the flash memory device may have a well structure generally corresponding to that of a conventional NOR type flash memory device. In other words, a cell array may be divided into a plurality of data blocks and in a triple-well (pocket-well) structure so as to apply a well bias to each data block independently. As seen in the triple well structure illustrated in FIG. 2, a first conductivity type well 54 is surrounded by a second conductivity type well 52 formed in a first conductivity type integrated circuit (semiconductor) substrate 50 and electrically isolated from the substrate 50. If a bias is applied to the first conductivity type well 54, the bias will generally not be applied to adjoining portions of the substrate 50 or to other first conductivity type wells. Thus, the well bias can be applied independently.

A first conductivity type well 56 is formed in a peripheral circuit. For example, a cell array may be organized as follows. An n-type deep well 52 is formed in a p-type substrate 50 to electrically isolate a p-type well 54, and a p-type well 56 is formed for a peripheral circuit. A device isolation layer 58 is formed between the well 54 and the well 56 to define a region. A plurality of cell transistors are formed on the p-type well 54 of the cell array (CELL). A cell transistor Tc in the NOR type cell array is connected to a plurality of parallel word lines Wn. The NOR type cell array includes a source region 60s and an independent drain region 60d. Source regions 60s of a plurality of cell transistors Tc are connected in parallel in a direction parallel to the word line Wn (into the page with reference to FIG. 2). Bit lines BL (one shown in FIG. 2) connecting a plurality of drain regions 60d in parallel are disposed intersecting the word line Wn.

The NOR type memory device includes a plurality of NMOS pass transistors which are disposed on the p-type well 56, separated from the p-type well 54 of the cell array (CELL). Pass transistors are formed in FIG. 2 with an LDD junction structure so they may provide a high breakdown voltage and a high voltage transistor, including a thick gate insulating layer. The pass transistors include a first high voltage transistor Ti having a source region 62 connected to the bit line BL and a plurality of second high voltage transistors Ti (i=2, 3, 4, . . . ) connected to the first high voltage transistor T1 in series. A drain region of the first high voltage transistor T1 is connected to a source region of the next (second in series) high voltage transistor through an interconnection 70. The source regions and the drain regions of the second high voltage transistors are connected to each other, also with the interconnection 70.

For the illustrated embodiments of FIG. 2, a gate of the first high voltage transistor is shown as a first gate G1, and a gate of the second and subsequent high voltage transistors is shown as a second gate Gi (I=2, 3, 4 . . . ). The first high voltage transistor T1 includes a first source region 62 connected to the bit line BL, and a first drain region 64 connected to the second high voltage transistor(s) Ti. The second high voltage transistor(s) Ti include a second source region 66s and a second drain region 66d that are formed at both side of the second gate Gi. The first drain region 64 is connected to a second source region 66s of a first of the second high voltage transistor(s) Ti. Therefore, the first high voltage transistor T1 and the second high voltage transistor(s) Ti are disposed with the source region and the drain region being connected (in series).

The first source region 62 is a first diffusion structure that includes a first lightly doped diffusion layer 62l and a first heavily doped diffusion layer 62h. The first lightly doped diffusion layer 62l adjoins a gate and the first heavily doped diffusion layer 62h is separated apart from the gate by the first lightly doped diffusion layer 62l. The second source region 66s and the second drain region 66d are a second diffusion structure that includes a second heavily doped diffusion layer 66h that is separated from the gate by a second lightly doped diffusion layer 66l neighboring the gate.

The first lightly doped diffusion layer 62l in the illustrated embodiments is wider than the second lightly doped diffusion layer 66l. Thus, the first heavily doped diffusion layer 62h is farther from the gate as compared to the second heavily doped diffusion layer 66h. In other words, the heavily doped diffusion layer of the first diffusion structure is separated from the gate farther than that of the second diffusion structure. As a result, the first diffusion structure may provide a breakdown voltage higher than that of the second diffusion structure, while the second diffusion structure may provide a larger amount of current because the second diffusion structure may have a resistance smaller than that of the first diffusion structure. The first drain region 64 may have the first diffusion structure or the second diffusion structure.

As noted above, a cell array structure of the NOR type flash memory device in some embodiments of the present invention may be the same as a general NOR type flash memory device cell array structure. As described for the embodiments of FIG. 2, a structure of a pass transistor that is connected to the bit line and turns on/off the bit line may differ from a general NOR type flash memory device.

FIG. 3A is a cross-sectional view illustrating pass transistors connected to a bit line of a NOR type flash memory integrated circuit device according to some embodiments of the present invention. As shown in the embodiments of FIG. 3A, the NOR type flash memory device includes a first high voltage transistor T1 connected to a bit line in the cell array and a plurality (one seen in FIG. 3A) of high voltage transistors Ti (i=2, 3, 4, . . . ) connected to the first high voltage transistor T1 in series. The first high voltage transistor T1 includes a first source region 112a and a first drain region 112b that are formed at both sides of the first gate G1. A bit line (not shown) is connected to the first source region 112a.

The second high voltage transistor Ti includes a second source region 114a and a second drain region 114b formed at both sides of the second gate Gi. The second source region 114a of the second high voltage transistor Ti is connected to the first drain region 112b, and the second source region 114a of the next serially connected second high voltage transistor(s) Ti is connected to the second drain region 114b thereof.

As shown in FIG. 3A, the first source region 112a has a first diffusion structure including a first lightly doped diffusion layer 104a adjoining the gate G1 and a first heavily doped diffusion layer 110a separated from the gate G1 by the first lightly doped diffusion layer 104a. The first drain region 112b, the second source region 114a and the second drain region 114b have a second diffusion structure including a lightly doped diffusion layer 104b adjoining the gate G1, Gi and a second heavily doped diffusion layer 110b separated from the gate G1, Gi by the second lightly doped diffusion layer 104b. A width of the second lightly doped diffusion layer 104b is narrower than that of the first lightly doped diffusion layer 104a. Therefore, a distance from the gate G1, Gi to the second heavily doped diffusion layer 110b is shorter than a distance to the first heavily doped diffusion layer 110a. Sidewall spacers 106 may be formed on sidewalls of the first gate G1 and the second gate Gi. [ ]

Methods for forming a NOR type flash memory integrated circuit device as discussed with reference to FIG. 3A will now be described for some embodiments of the present invention with reference to the cross-sectional illustrations of FIGS. 4, 5 and 6A. As shown in FIG. 4, a device isolation layer 102 is formed in a substrate 100 to define a plurality of active regions, and a first gate G1 and a plurality of second gates Gi (one shown in FIG. 4) are formed. Using the gates as an ion implantation mask, low-concentration impurities are implanted in the substrate to form a lightly doped diffusion layer 104. Note that, through this stage, a conventional method of forming a NOR type flash memory device may be utilized and a plurality of memory cell gates may be formed in a cell array of the memory device.

As shown in the embodiments of FIG. 5, a sidewall spacer 106 is formed on each sidewall of the first gate G1 and the second gate Gi. Referring now to FIG. 6, a photoresist layer is formed on an entire surface of the resultant structure having the sidewall spacers and the photoresist layer is patterned to form a first photoresist pattern 108a and a second photoresist pattern 108b. The first photoresist pattern 108a extends from an upper portion of the first gate G1 to cover a portion of the lightly doped diffusion layer 104. The second photoresist pattern 108b extends from an upper portion of the second gate Gi to cover a portion of the lightly doped diffusion layer 104.

Figure 6A:
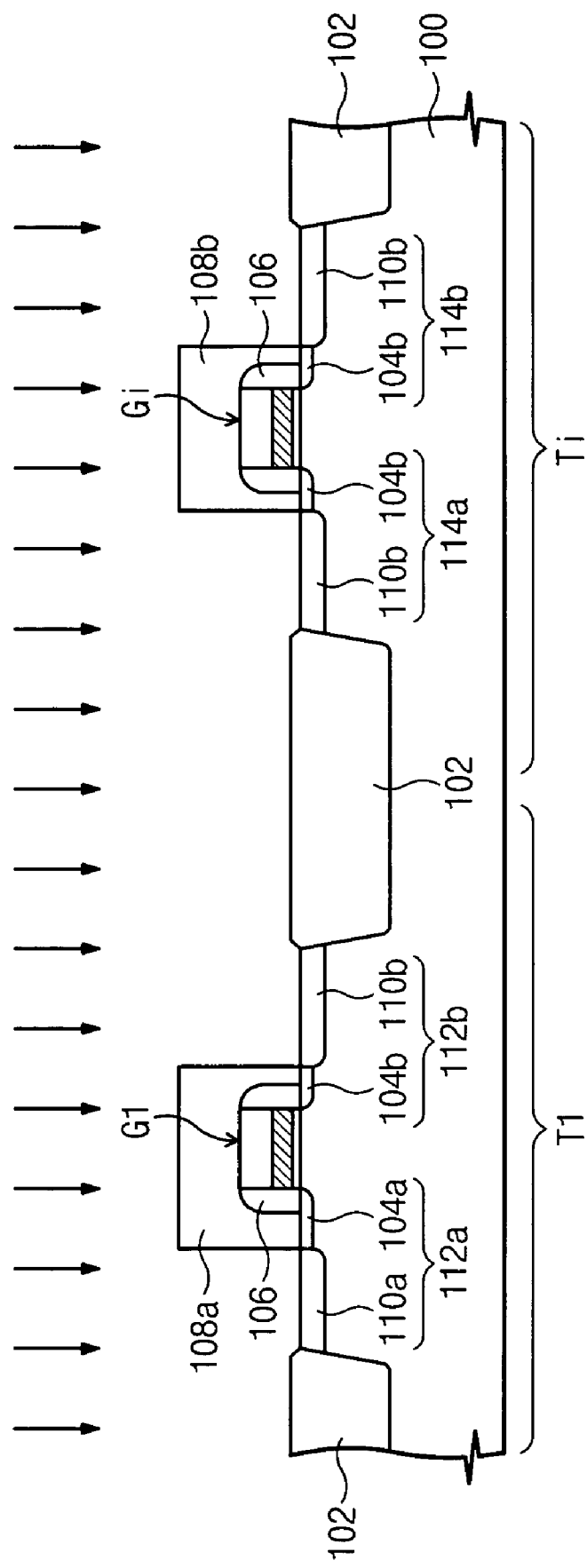

In the embodiments of FIG. 6A, the first photoresist pattern 108a is extended asymmetrically to widen the lightly doped diffusion layer 104 at one side of the first gate G1. In other words, the photoresist pattern at one side of the first gate G1 is extended wider than the photoresist pattern at the other side of the first gate G1 and those at both sides of the second gate Gi.

High-concentration impurity ions are implanted in the substrate 100 using the first photoresist pattern 108a and the second photoresist pattern 108b as an ion implantation mask. As a result, a first source region 112a and a first drain region 112b are formed in the substrate 100 at respective sides of the first gate G1. The first source region 112a has a first diffusion structure including a first lightly doped diffusion layer 104a and a first heavily doped diffusion layer 110a. The first drain region 112b has a second diffusion structure including a second lightly doped diffusion layer 104b and a second heavily doped diffusion layer 110b. The first lightly doped diffusion layer 104a is wider than the second lightly doped diffusion layer 104b. As such, the first heavily doped diffusion layer 110a is separated apart from the gate farther than the second heavily doped diffusion layer 10b. A second source region 114a and a second drain region 114b are formed in the substrate 100 at both sides of the second gate Gi. The second source region 114a and the second drain region 114b have the second diffusion structure.

FIG. 3B is a cross-sectional view illustrating pass transistors connected to a bit line of a NOR type flash memory device according to further embodiments of the present invention. As shown in the embodiments of FIG. 3B, the NOR type flash memory device includes a first high voltage transistor T1 and a plurality of second high voltage transistor Ti (one shown in FIG. 3B). The first high voltage transistor T1 is connected to a bit line of the cell array as in the embodiments of FIG. 3A. The second high voltage transistors Ti (i=2, 3, 4, . . . ) are connected in series to the first high voltage transistor T1.

The first high voltage transistor T1 includes a first source region 112a and a first drain region 112b formed at both sides of the gate G1. The bit line (not shown) is connected to the first source region 112a. The second high voltage transistor Ti includes a second source region 114a and a second drain region 114b formed at both side of the second gate Gi. A sidewall spacer 106 is formed on each sidewall of the first gate Gi and the second gate Gi.

The first source region 112a has a first diffusion structure including a first lightly doped diffusion layer 104a and a first heavily doped diffusion layer 110a. The first lightly doped diffusion layer 104a extends in the substrate 100 beyond the sidewall spacer 106. The first heavily doped diffusion layer 110a is separated from the first gate G1 by the first lightly doped diffusion layer 104a. The first drain region 112b, the second source region 114a and the second drain region 114b have a second diffusion including a second lightly doped diffusion layer 104b formed under the sidewall spacer 106a and a second heavily doped diffusion layer 110b separated from the gate by the second lightly doped diffusion layer 104b. A boundary between the second lightly doped diffusion layer 104b and the second heavily doped diffusion layer 110b is aligned to the sidewall spacer 106.

Figure 6B:
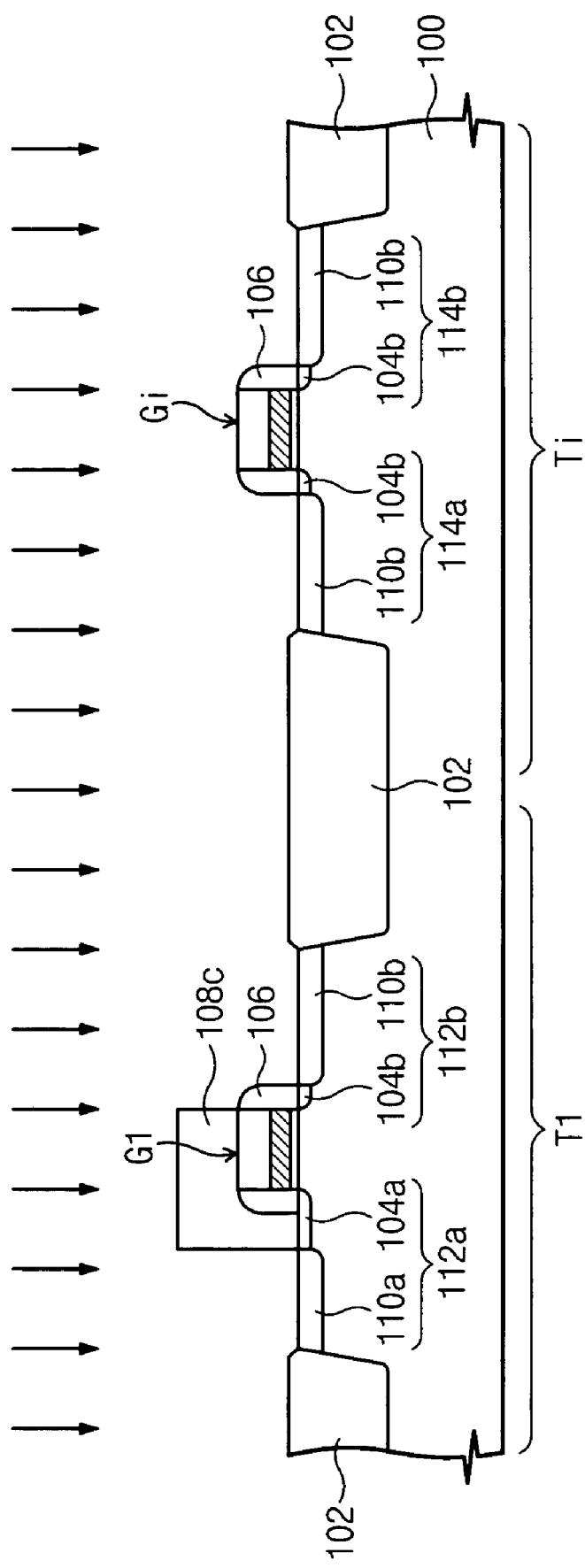

FIG. 6B illustrates methods of forming the NOR type flash memory device of FIG. 3B according to some embodiments of the present invention. As shown in FIG. 6B, lightly doped diffusion layers 104 may be formed in the substrate 100 at both sides of the first gate G1 and the second gate Gi in the same manner as previously described with reference to FIGS. 4 and 5. A photoresist layer is formed on an entire surface of the substrate 100 including the sidewall spacer 106. The photoresist layer is patterned to form a photoresist pattern 108c covering an upper portion of the first gate G1 as seen in FIG. 6B. The photoresist pattern 108c extends asymmetrically so that in one direction it covers a greater portion of the lightly doped diffusion layer 104.

Using the photoresist pattern 108c as an ion implantation mask, high-concentration ions are implanted in the substrate 100 to form a first heavily doped diffusion layer 110a that is aligned to the photoresist pattern 108c. A second heavily doped diffusion layer 110b is formed that is aligned to the sidewall spacer 106. A first source region 112a is formed at one side of the gate G1, which has a first diffusion structure including a first lightly doped diffusion layer 104a and a first heavily doped diffusion layer 110a. The first lightly doped diffusion layer 104a adjoins the first gate G1 and the first heavily doped diffusion layer 110a is separated from the first gate G1 by the first lightly doped diffusion layer 104a.

A first drain region 112b is formed at the other side of the gate G1, which has a second diffusion structure including a second lightly doped diffusion layer 104b and a second heavily doped diffusion layer 110b. The second lightly doped diffusion layer 104b adjoins the first gate G1. The second heavily doped diffusion layer 110b is separated from the first gate G1 by the second lightly doped diffusion layer 104b. A second source region 114a and a second drain region 114b having the second diffusion structure are formed at respective sides of the second gate Gi. The second diffusion structure includes a second heavily doped diffusion layer 110b and the second lightly doped diffusion layer 104b.

As seen in the embodiments of FIG. 6B, a width of the first lightly doped diffusion layer 104a is extended outside the sidewall spacer 106 a length determined by the extended width of the photoresist pattern 108c. The second lightly doped diffusion layer 104b is placed under the sidewall spacer 106. A boundary between the second lightly doped diffusion layer 104b and the second heavily doped diffusion layer 110b is aligned to the sidewall spacer 106. Therefore, a distance (width) from the gate electrode G1 to the heavily doped diffusion layer 110a is longer in the first diffusion structure than to the heavily doped diffusion layer 110b in the second diffusion structure.

Figure 7A:
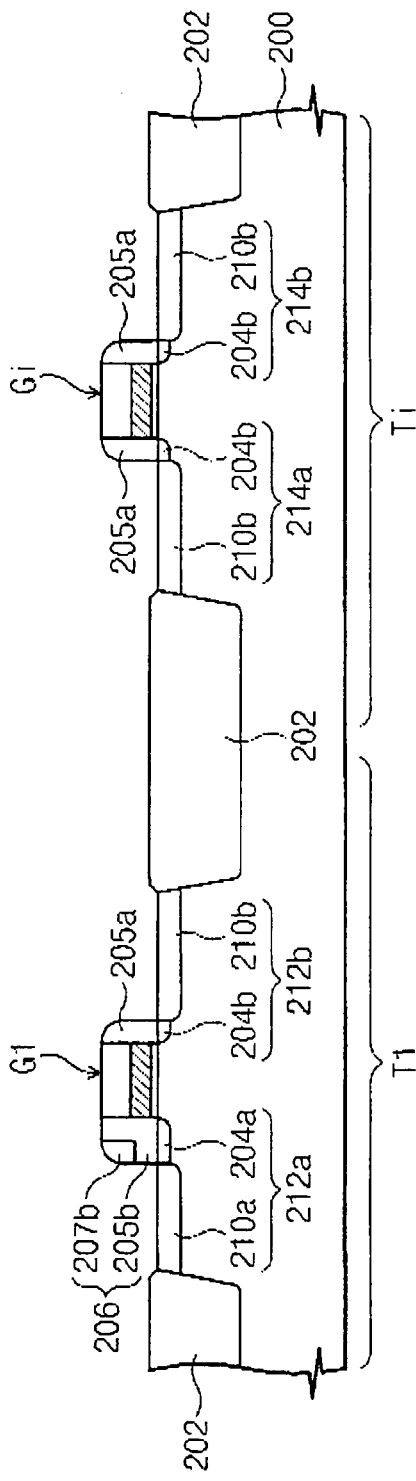
FIGS. 7A and 7B are cross-sectional views illustrating pass gates of a NOR type flash memory integrated circuit device according to further embodiments of the present invention.

Further embodiments of the present invention will now be described with reference to FIG. 7A. FIG. 7A is a cross-section illustration of pass transistors connected to a bit line of a NOR type flash memory device. As shown in the embodiments of FIG. 7A, the NOR type flash memory integrated circuit device includes a first high voltage transistor T1 connected to a bit line of the cell array and a plurality (one shown in FIG. 7A) of second high voltage transistors Ti i=2, 3, 4, . . . ) connected to the first high voltage transistor Ti in series as in the embodiments of FIG. 3A. The first high voltage transistor T1 includes a first source region 212a and a first drain region 212b that are formed at respective sides of the first gate G1. The bit line (not shown) is connected to the first source region 212a. The second high voltage transistor Ti may include a source region 214a and a second drain region 214b that are formed on respective sides of the second gate Gi.

A first sidewall spacer 206 is formed on one sidewall of the first gate G1. The first sidewall spacer 206 includes an L-shaped lower spacer 205b and an upper spacer 207b formed on the L-shaped lower spacer 205b. A single structure second sidewall spacer 205a is formed on the other sidewall of the first gate G1 and both sidewalls of the second gate Gi. The first source region 212a has a first diffusion structure including a first lightly doped diffusion layer 204a and a first heavily doped diffusion layer 210a. The first lightly doped diffusion layer 204a is formed under the first sidewall spacer 206, and the first heavily doped diffusion layer 210a is separated from the first gate G1 by the first lightly doped diffusion layer 204a.

The first drain region 212b, the second source region 214a and the second drain region 214b each have a second diffusion structure. The second diffusion structure includes a second lightly doped diffusion layer 204b formed under the second sidewall spacer 205a and a second heavily doped diffusion layer 210b separated from the gate by the second lightly doped diffusion layer 204b.

A boundary between the first lightly doped diffusion layer 204a and the first heavily doped diffusion layer 210a is aligned to the first sidewall spacer 206. A boundary between the second lightly doped diffusion layer 204b and the second heavily doped diffusion layer 210b is aligned to the second sidewall spacer 205a.

FIGS. 8, 9A and 10A are cross-sectional views illustrating methods of forming the NOR type flash memory integrated circuit device of FIG. 7A according to some embodiments of the present invention. As shown in FIG. 8, a device isolation layer 202 is formed in a substrate 200, and a gate of a first high voltage transistor T1 (a first gate G1) and a gate of a second high voltage transistor Ti (a second gate Gi) may be formed in a manner as described previously with reference to FIG. 4. Low-concentration impurities are implanted in the substrate 200 at both sides of the first gate G1 and the second gate Gi to form a light doped diffusion layer 204. A lower spacer insulating layer 205 and an upper spacer insulating layer 207 are conformally stacked on an entire surface of the substrate 200 including the lightly doped diffusion layer 204.

Referring now to FIG. 9A, the upper spacer insulating layer 207 is etched, for example, by an anisotropic etch process, to form an upper spacer 207a. A photoresist pattern 208a is formed to cover a portion of the substrate 200 having the upper spacer 207a. The photoresist pattern 208a extends on one side of the first gate G1 to cover a portion of the lower spacer insulating layer 205 and the upper spacer 207a that are formed on a source region of the first high voltage transistor T1.

As shown in FIG. 10A, the upper spacer 207a is removed using the photoresist pattern 208a as an etch mask and the photoresist pattern 208a is removed. The lower spacer insulating layer 205 may then be continuously etched, for example, by an anisotropic etch process, to form a first sidewall spacer 206 on one sidewall of the first gate G1. In addition, single layer second sidewall spacers 205a may be simultaneously formed on the other sidewall of the first gate G1 and sidewalls of the second gate Gi.

High-concentration impurities are implanted in the substrate 200 including the first sidewall spacer 206 and the second sidewall spacer(s) 205a to form a first source region 212a and a first drain region 212b in the substrate 200 at respective sides of the first gate G1. A second source region 214a and a second drain region 214b are formed in the substrate 200 at respective sides of the second gate Gi. The first source region 212a has a first diffusion structure, and the first drain region 212b, the second source region 214a, and the second drain region 214b have a second diffusion structure.

The first diffusion structure includes a first lightly doped diffusion layer 204a formed under the first sidewall spacer 206 and a first heavily doped diffusion layer 210a separated from the gate G1 by the first lightly doped diffusion layer 204a. The second diffusion structure includes a second lightly doped diffusion layer 204b formed under the second sidewall spacer 205a and a second heavily doped diffusion layer 210b separated from the gate G1, Gi by the second lightly doped diffusion layer 204b. A width of the first lightly doped diffusion layer 204a is formed to be greater than that of the second lightly doped diffusion layer 204b, corresponding to the widths of the first sidewall spacer 206 and the second sidewall spacer 205a. A boundary between the first lightly doped diffusion layer 204a and the first heavily doped diffusion layer 210a is aligned to the first sidewall spacer 206. A boundary between the second lightly doped diffusion layer 204b and the second heavily doped diffusion layer 210b is aligned to the second sidewall spacer 205a. As such, a distance (width) from the gate G1 to the first heavily doped diffusion layer 210a is greater than a distance from the gate G1, Gi to the second heavily doped diffusion layer 210b.

In various embodiments of the present invention, such as those illustrated in FIG. 7A, a large amount of current may be provided by applying a high breakdown voltage to the first source region 212a, of which a voltage is boosted during an erasing operation because it is connected to the bit line, and decreased to the first drain region 212b, the second source region 214a, and the second drain region 214b where a high voltage is not applied or boosted.

Figure 7B:
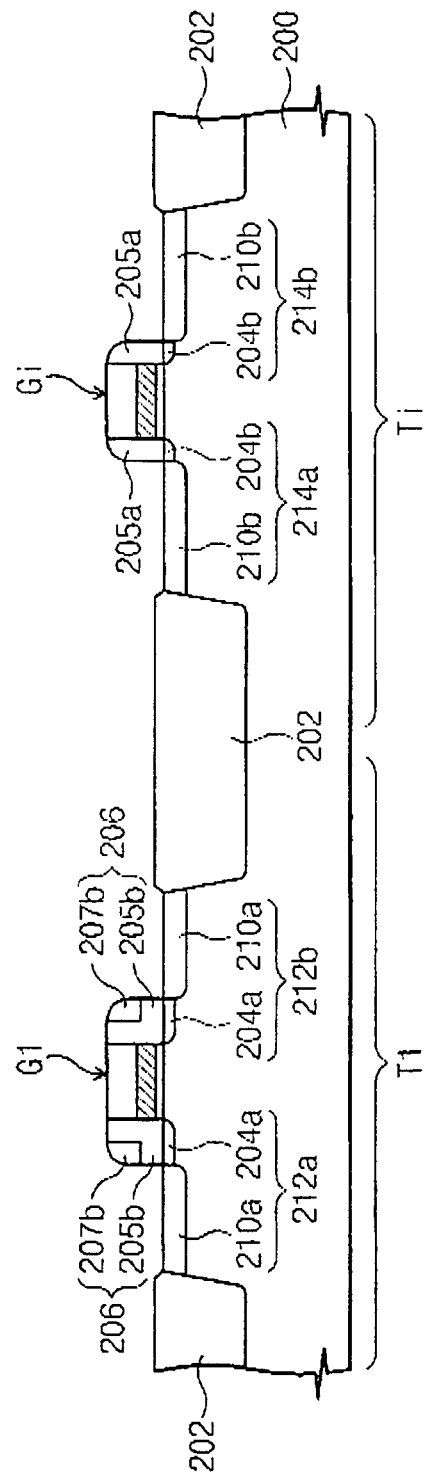

FIG. 7B is a cross-sectional view illustrating pass transistors connected to a bit line of a NOR type flash memory device according to yet further embodiments of the present invention. As shown in the embodiments of FIG. 7B, the NOR type flash memory device includes a first high voltage transistor T1 connected to the bit line (not shown) of the cell array and a plurality (one shown in FIG. 7B) of second high voltage transistors Ti (i=2, 3, 4 . . . ) connected to the first high voltage transistor T1 in series as in the previously described embodiments. The first high voltage transistor T1 includes a first source region 212a and a first drain region 212b that are formed at respective sides of a first gate G1. The bit line is connected to the first source region 212a. The second high voltage transistor Ti includes a second source region 214a and a second drain region 214b formed at respective sides of a second gate Gi.

A first sidewall spacer 206 is formed on each sidewall of the first gate G1. The first sidewall spacer 206 includes an L-shaped lower spacer 205b and an upper spacer 205b formed on the L-shaped lower spacer 205b. A single structure (layer) second sidewall spacer 205a is formed on respective sidewalls of the second gate Gi.

The first source region 212a and the first drain region 212b have a first diffusion structure. The second source region 214a and the second drain region 214b have a second diffusion structure. The first diffusion structure includes a first lightly doped diffusion layer 204a formed under the first sidewall spacer 206 and a first heavily doped diffusion layer 210a separated from the gate G1 by the first lightly doped diffusion layer 204a. The second diffusion structure includes a second lightly doped diffusion layer 204b formed under the second sidewall spacer 205a and a second heavily doped diffusion layer 210b separated from the gate Gi by the second lightly doped diffusion layer 204b. A width of the first lightly doped diffusion layer 204a is formed wider than that of the second lightly doped diffusion layer 204b, corresponding to widths of the first sidewall spacer 206 and the second sidewall spacer 205a. A boundary of the first lightly doped diffusion layer 204a and the first heavily doped diffusion layer 210a is aligned to the first sidewall spacer 206. A boundary between the second lightly doped diffusion layer 204b and the second heavily doped diffusion layer 210b is aligned to the second sidewall spacer 205a. Thus, the first heavily doped diffusion layer 210a is formed farther from the gate G1 than the second heavily doped diffusion layer 210b is formed from the gate Gi. As a result, large amount of current may be achieved by applying a high breakdown voltage to the first source region 212a, of which voltage is boosted during erasing because it is connected to the bit line and decreasing the second source region 214a, and the second drain region 214b where a high voltage is not applied or boosted.

Figure 10B:
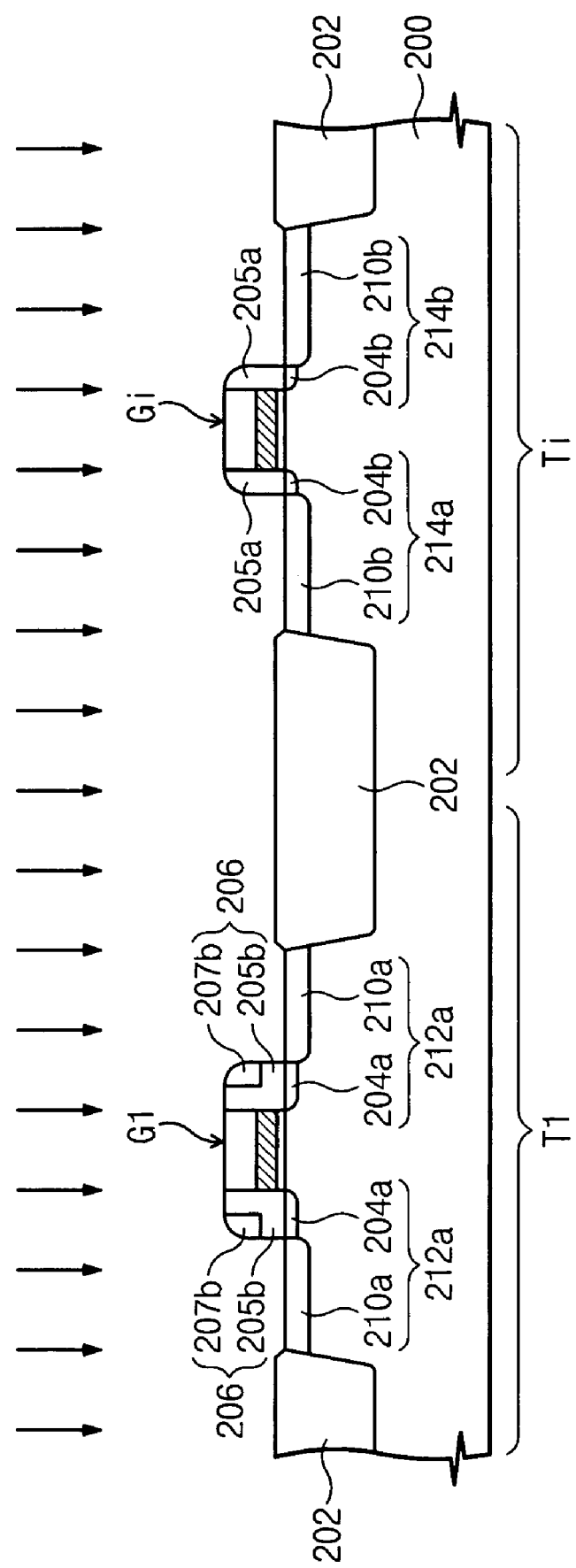

FIGS. 9B and 10B are cross-sectional views illustrating methods of forming the NOR type flash memory device of FIG. 7B according to some embodiments of the present invention. Referring to FIG. 9B, up until the upper spacer 207a is formed on the lower spacer insulating layer 205, the processes of forming the device of FIG. 7B may be performed in substantially the same manner as described previously with reference to FIGS. 8 and 9A. A photoresist pattern 208b is formed to cover a portion of the substrate 200. The photoresist pattern 208b covers a region including the first high voltage transistor T1.

Referring now to FIG. 10B, the upper spacer 207a is removed using the photoresist pattern 208b as an etch mask and then the photoresist pattern 208b is removed. The lower spacer insulating layer 205 may be continuously etched, for example, by an anisotropic etch process, to form a first sidewall spacer 206 on each sidewall of the first gate G1. The first sidewall spacer 206 includes an L-shape lower spacer 205b and a residual upper spacer 207b. In addition, a single structure (layer) second sidewall spacer 205a is formed on each sidewall of the second gate Gi.

High-concentration impurity ions are implanted in the substrate 200 in the region including the first sidewall spacer 206 and the second sidewall spacer 205a, thereby forming a first source region 212a and a first drain region 212b in the substrate 200 at respective sides of the first gate G1. Simultaneously, a second source region 214a and a second drain region 214b may be formed in the substrate 200 at respective sides of the second gate Gi. The first source region 212a and the first drain region 212b have a first diffusion structure. The second source region 214a and the second drain region 214b have a second diffusion structure.

The first diffusion structure includes a first lightly doped diffusion layer 204a formed under the first sidewall spacer 206 and a first heavily doped diffusion layer 210a separated from the gate by the first lightly doped diffusion layer 204a. The second diffusion structure includes a second lightly doped diffusion layer 204b formed under the second sidewall spacer 205a and a second heavily doped diffusion layer 210b separated from the gate Gi by the second lightly doped diffusion layer 204b. A boundary of the first heavily doped diffusion layer 210a and a boundary of the second heavily doped diffusion layer 210b are aligned to the first sidewall spacer 206 and the second sidewall spacer 205a, respectively. Therefore, a distance (width) from the gate G1 to the first heavily doped diffusion layer 210a is farther than a distance from the gate Gi to the second heavily doped diffusion layer 210b. As such, a high breakdown voltage can be provided to the first source region 212a and the first drain region 212b. The second source region 214a and the second drain region 214b having the second diffusion structure, which includes a heavily doped diffusion layer relatively close to the gate electrode, can have low resistance.

As described above, the NOR type flash memory device of some embodiments of the present invention includes a pass transistor for selecting a bit line that is connected to a bit line decoder. The pass transistor is connected to the bit line and selectively turned on or off based on an operation mode of the device. According to some embodiments of the present invention, a source region of the (first) transistor directly connected to the bit line is formed to have a diffusion structure providing a relatively high breakdown voltage. Source and drain regions of the pass transistors connected to each other are formed to have a diffusion structure having a relatively low resistance. Therefore, even if a voltage of a floated node is boosted during an erasing operation of the cell transistor, a junction breakdown can be suppressed and a large amount of current may be ensured during a data reading operation of the cell transistor, which may increase a sensing margin.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A flash memory integrated circuit device, comprising:
an integrated circuit substrate;
a cell array including a plurality of cell transistors on the integrated circuit substrate;
a bit line coupled to ones of the plurality of cell transistors;
a first pass transistor coupled to the bit line, the first pass transistor having a first diffusion structure configured to provide a breakdown voltage higher than that of a second diffusion structure; and
at least one second pass transistor coupled to the first pass transistor, the at least one second pass transistor having the second diffusion structure.

2. The device of claim 1 wherein the second diffusion structure has a resistance smaller than a resistance of the first diffusion structure.

3. The device of claim 2 wherein the first diffusion structure includes a first lightly doped diffusion layer adjacent a gate of the first pass transistor and a first heavily doped diffusion layer separated from the gate by the first lightly doped diffusion layer, the first diffusion structure defining a source or drain region of the first pass transistor that is coupled to the bit line.

4. The device of claim 3 wherein the second diffusion structure includes a second lightly doped diffusion layer adjacent a gate of the at least one second pass transistor and a second heavily doped diffusion layer separated from the gate of the at least one second pass transistor by the second lightly doped diffusion layer, the first lightly doped diffusion layer having a width from the gate of the first pass transistor to the first heavily doped diffusion layer greater than a width of the second lightly doped diffusion layer from the gate of the at least one second pass transistor to the second heavily doped diffusion layer.

5. The device of claim 4 wherein the first diffusion structure comprises a source of the first pass transistor and wherein a drain of the first pass transistor comprises the second diffusion structure.

6. The device of claim 4 further comprising sidewall spacers formed on the gate of the first pass transistor and on the gate of the second pass transistor and wherein a boundary between the second lightly doped diffusion layer and the second highly doped diffusion layer is aligned to one of the sidewall spacers.

7. The device of claim 6 wherein a width of one of the sidewall spacers associated with the first diffusion structure is wider than a width of the one of the sidewall spacers aligned with the boundary between the second lightly doped diffusion layer and the second highly doped diffusion layer.

8. The device of claim 4 wherein the first pass transistor and the at least one second pass transistor comprise high voltage transistors.

9. The device of claim 4 wherein the first diffusion structure comprises a source of the first pass transistor and wherein a drain of the first pass transistor comprises the first diffusion structure.

10. A flash memory device, comprising:
a cell array including a plurality of cell transistors;
a bit line coupled in parallel to drains of specific ones of the cell transistors;
a first high voltage transistor including a source region having a first diffusion structure connected to the bit line, a drain region and a gate between the source region and the drain region; and
a plurality of second high voltage transistors connected in series to the drain of the first high voltage transistor, the second high voltage transistors each including a source region and a drain region having a second diffusion structure and a gate between the source region and the drain region thereof;
wherein the first diffusion structure includes a first lightly doped diffusion layer neighboring the gate of the first high voltage transistor and a first heavily doped diffusion layer separated from the gate of the first high voltage transistor by the first lightly doped diffusion layer, and
wherein the second diffusion structure includes a second lightly doped diffusion layer neighboring the gate of one of the second high voltage transistors, having a width smaller than a width of the first lightly doped diffusion layer, and a second heavily doped diffusion layer separated apart from the gate of the one of the second high voltage transistors, the second highly doped diffusion layer being nearer its associated gate than the first heavily doped diffusion layer is to the gate of the first high voltage transistor.

11. The device of claim 10, wherein the drain of the first high voltage transistor has the second diffusion structure.

12. The device of claim 11, further comprising a sidewall spacer formed on each gate sidewall of the first and second high voltage transistors, wherein the first lightly doped diffusion layer and the second lightly doped diffusion layer extend beyond the sidewall spacers.

13. The device of claim 11, further comprising a sidewall spacer formed on each gate sidewall of the first and second high voltage transistors, wherein the first lightly doped diffusion layer extends out beyond the sidewall spacer, and wherein a boundary between the second lightly doped diffusion layer and the second heavily doped diffusion layer overlaps associated ones of the sidewall spacers.

14. The device of claim 11 further comprising a sidewall spacer formed on each gate sidewall of the first and second high voltage transistors, wherein a width of a sidewall spacer on the first diffusion structure is wider than a width of a sidewall spacer on the second diffusion structure.

15. The device of claim 10, wherein the drain of the first high voltage transistor has the first diffusion structure.

16. The device of claim 15, further comprising a sidewall spacer formed on each gate sidewall of the first and second high voltage transistors, wherein a width of a sidewall spacer on the first diffusion structure is wider than a width of a sidewall spacer on the second diffusion structure.

17. A flash memory device, comprising:
a cell array including a plurality of cell transistors;
a bit line coupled in parallel to drains of specific ones of the cell transistors;
a first high voltage transistor having a source region of a first diffusion structure connected in series to the bit line and a drain region having a second diffusion structure and a gate between the source and the drain;

a plurality of second high voltage transistors connected in series to the drain of the first high voltage transistor, ones of the second high voltage transistors including a source region and a drain region having the second diffusion structure and a gate therebetween; and sidewall spacers formed on sidewalls of the gates of the first and second high voltage transistors; and wherein the first diffusion structure includes a first lightly doped diffusion layer adjacent the gate of the first high voltage transistor and a first heavily doped diffusion layer separated apart from the gate of the first high voltage transistor by the first lightly doped diffusion layer;

wherein the second diffusion structure includes a second lightly doped diffusion layer formed under a sidewall spacer of an associated gate, adjacent the associated gate, and a second heavily doped diffusion layer separated from the associated gate by the second lightly doped diffusion layer; and wherein a boundary of the second heavily doped diffusion layer is aligned to the sidewall spacer of the associated gate.

18. The device of claim 17, wherein a first sidewall spacer is formed on the first diffusion structure, and a second sidewall spacer having a width narrower than a width of the first sidewall spacer is formed on the second diffusion structure.

19. A flash memory device, comprising:

a cell array including a plurality of cell transistors;

a bit line coupled in parallel to specific ones of the cell transistors;

a first high voltage transistor including a source region and a drain region having a first diffusion structure, the source region being connected in series to the bit line;

a plurality of second high voltage transistors connected to the drain of the first high voltage transistor in series, including a source region and a drain region having a second diffusion structure; and a sidewall spacer formed on sidewalls of gates of the first and second high voltage transistors;

wherein the first diffusion structure includes a first lightly doped diffusion layer neighboring the gate of the first high voltage transistor and a first heavily doped diffusion layer separated apart from the gate of the first high voltage transistor by the first lightly doped diffusion layer;

wherein the second diffusion structure includes a second lightly doped diffusion layer formed under the sidewall spacer of an associated gate and located adjacent the associated gate and a second heavily doped diffusion layer separated from the associated gate by the second lightly doped diffusion layer; and wherein a boundary of the second heavily doped diffusion layer is aligned to the sidewall spacer of the associated gate.

20. The device of claim 19, wherein a first sidewall spacer is formed on the first diffusion structure, and a second sidewall spacer having a width narrower than a width of the first sidewall spacer is formed on the second diffusion structure.

* * * * *